(12) United States Patent
Li

(10) Patent No.: US 10,573,563 B2
(45) Date of Patent: Feb. 25, 2020

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/863,581

(22) Filed: Jan. 5, 2018

(65) Prior Publication Data
US 2018/0197786 A1    Jul. 12, 2018

(30) Foreign Application Priority Data

Jan. 6, 2017   (CN) .......................... 2017 1 0010912

(51) Int. Cl.
*H01L 21/8234* (2006.01)
*H01L 21/28* (2006.01)
(Continued)

(52) U.S. Cl.
CPC .. *H01L 21/823462* (2013.01); *H01L 21/0223* (2013.01); *H01L 21/0273* (2013.01); *H01L 21/02164* (2013.01); *H01L 21/268* (2013.01); *H01L 21/28185* (2013.01); *H01L 21/31053* (2013.01); *H01L 21/31116* (2013.01); *H01L 21/823431* (2013.01); *H01L 21/823437* (2013.01); *H01L 21/823821* (2013.01); *H01L 21/823828* (2013.01); *H01L 27/0886* (2013.01); *H01L 27/0924* (2013.01); *H01L 29/42364* (2013.01); *H01L 29/42376* (2013.01);
(Continued)

(58) Field of Classification Search
CPC . H01L 29/4966; H01L 29/517; H01L 21/324; H01L 21/28185; H01L 29/66545
See application file for complete search history.

(56) References Cited

U.S. PATENT DOCUMENTS 8,603,881 B1 * 12/2013 Alptekin ........... H01L 29/41783
                                                  438/300
9,437,714 B1 *  9/2016 Adusumilli ....... H01L 29/66795
(Continued)

*Primary Examiner* — Matthew L Reames
*Assistant Examiner* — John A Bodnar
(74) *Attorney, Agent, or Firm* — Anova Law Group, PLLC

(57) ABSTRACT

A semiconductor structure and a method for fabricating the semiconductor structure are provided. The method includes providing a base substrate, and forming an interlayer dielectric layer on the base substrate and having an opening exposing surface portions of the base substrate. The method also includes forming a stacked structure on a bottom and sidewall of the opening and on a top of the interlayer dielectric layer. In addition, the method includes removing at least a first portion of the stacked structure from the top of the interlayer dielectric layer. Further, the method includes performing an annealing treatment on the base substrate, and forming a gate structure by filling the opening with a metal layer.

15 Claims, 10 Drawing Sheets

(51) Int. Cl.
  *H01L 21/02*      (2006.01)
  *H01L 29/51*      (2006.01)
  *H01L 21/3105*    (2006.01)
  *H01L 21/311*     (2006.01)
  *H01L 21/027*     (2006.01)
  *H01L 21/268*     (2006.01)
  *H01L 27/088*     (2006.01)
  *H01L 29/66*      (2006.01)
  *H01L 29/423*     (2006.01)
  *H01L 21/8238*    (2006.01)
  *H01L 27/092*     (2006.01)
  *H01L 29/06*      (2006.01)
  *H01L 29/49*      (2006.01)

(52) U.S. Cl.
  CPC ... *H01L 29/66545* (2013.01); *H01L 21/31111* (2013.01); *H01L 21/823842* (2013.01); *H01L 21/823857* (2013.01); *H01L 29/0649* (2013.01); *H01L 29/4966* (2013.01); *H01L 29/513* (2013.01); *H01L 29/517* (2013.01)

(56) References Cited

U.S. PATENT DOCUMENTS

| | | | |
|---|---|---|---|
| 2011/0006354 A1* | 1/2011 | Jangjian | H01L 29/4966 257/314 |
| 2011/0127590 A1* | 6/2011 | Binder | H01L 21/28088 257/288 |
| 2012/0122283 A1* | 5/2012 | Lee | H01L 21/82343 438/287 |
| 2014/0141598 A1* | 5/2014 | Ando | H01L 29/4232 438/478 |
| 2016/0315171 A1* | 10/2016 | Hung | H01L 29/66545 |
| 2017/0053996 A1* | 2/2017 | Kim | H01L 21/28088 |
| 2017/0110550 A1* | 4/2017 | Tsai | H01L 29/4966 |
| 2017/0162675 A1* | 6/2017 | Yim | H01L 21/0217 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710010912.0, filed on Jan. 6, 2017, the entirety of which is incorporated herein by reference.

FIELD OF THE DISCLOSURE

The present disclosure generally relates to the field of semiconductor manufacturing technology and, more particularly, relates to a semiconductor structure and fabrication method thereof.

BACKGROUND

The semiconductor device in an integrated circuit, especially in an ultra-large scale integrated circuit, includes a metal-oxide-semiconductor field effect transistor (MOSFET). With continuous development of integrated circuit manufacturing technology, process node of the semiconductor device continues to decrease, and geometric dimensions of the semiconductor device continue to shrink following Moore's law. When the size of the semiconductor device is reduced to a certain extent, various secondary effects caused by physical limit of the semiconductor device have been emerged, and feature dimensions of the semiconductor device become more and more difficult to scale down. Among them, in the field of semiconductor manufacturing, how to solve a large leakage current issue of the semiconductor device is most challenging. The large leakage current of the semiconductor device is mainly caused by the continuous decreasing of the thickness of a conventional gate dielectric layer.

Currently, a high-K gate dielectric material is used to replace the conventional silicon dioxide gate dielectric material, and a metal material is used as a gate electrode to avoid a Fermi level pinning effect between the high-K material and a conventional gate electrode material as well as a boron permeation effect. The use of the high-K material and the metal gate reduces the leakage current of the semiconductor device.

Although the use of the high-K material and the metal gate can improve the electrical performance of the semiconductor device to a certain extent, the electrical performance and yield of the conventional semiconductor device still need to be improved. The disclosed device structures and methods are directed to solve one or more problems set forth above and other problems in the art.

BRIEF SUMMARY OF THE DISCLOSURE

One aspect of the present disclosure includes a method for fabricating a semiconductor structure. The method includes providing a base substrate, and forming an interlayer dielectric layer on the base substrate and having an opening exposing surface portions of the base substrate. The method also includes forming a stacked structure on a bottom and sidewall of the opening and on a top of the interlayer dielectric layer. In addition, the method includes removing at least a first portion of the stacked structure from the top of the interlayer dielectric layer. Further, the method includes performing an annealing treatment on the base substrate, and forming a gate structure by filling the opening with a metal layer.

Another aspect of the present disclosure includes a semiconductor structure. The semiconductor structure includes a base substrate, and an interlayer dielectric layer on the base substrate and having an opening exposing surface portions of the base substrate. The semiconductor structure also includes a stacked structure in the opening and having a top surface lower than the opening. Further, the semiconductor structure includes a metal layer on the stacked structure in the opening.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
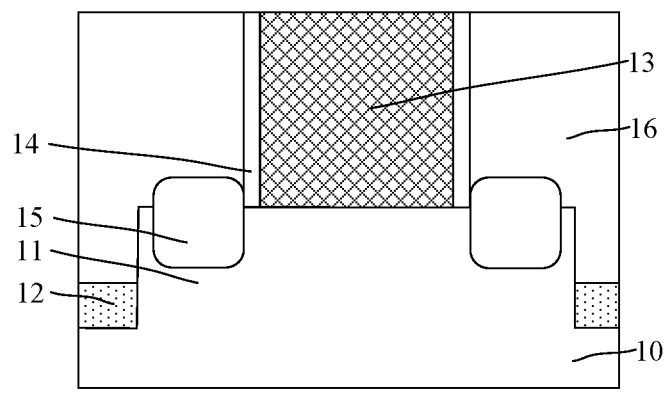
FIGS. 1-2 illustrate semiconductor structures corresponding to certain stages for forming a semiconductor structure.
Figure 2:
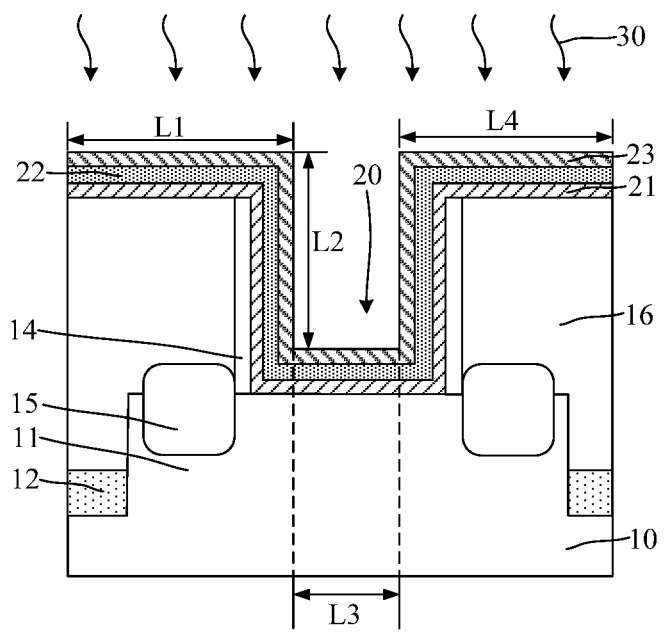

FIGS. 1-2 illustrate semiconductor structures corresponding to certain stages for forming a semiconductor structure. Referring to FIG. 1, a base substrate is provided. The base substrate includes a substrate 10 and a discrete fin 11 on the substrate 10. An isolation structure 12 is formed on the substrate 10 exposed by the fin 11, and the isolation structure 12 also covers portions of sidewall of the fin 11. A dummy gate structure 13 is formed on the fin 11 and across a length portion of the fin 11. The dummy gate structure 13 also covers portions of top and sidewall of the fin 11. A sidewall spacer 14 is formed on the sidewall of the fin 11. Source and drain doped regions 15 are formed in the fin 11 on both sides of the dummy gate structure 13 after forming the sidewall spacer 14. An interlayer dielectric layer 16 is formed on the base substrate exposed by the dummy gate structure 13. The interlayer dielectric layer 16 exposes top of the dummy gate structure 13.

Referring to FIG. 2, the dummy gate structure 13 (shown in FIG. 1) is removed to form an opening 20 in the interlayer dielectric layer 16. The opening 20 exposes portions of the fin 11. A stacked structure (not illustrated) is formed in the opening 20.

In one embodiment, referring to FIG. 2, the method for forming the stacked structure includes: forming a high-K gate dielectric layer 21 on a bottom and sidewall of the opening 20, where the high-K gate dielectric layer 21 also covers top of the interlayer dielectric layer 16; forming a capping layer 22 on the high-K gate dielectric layer 21; and forming an amorphous silicon layer 23 on the capping layer 22.

Referring to FIG. 2, after forming the stacked structure, an annealing treatment is performed on the base substrate. The annealing treatment improves the formation quality of the high-K gate dielectric layer 21. The annealing treatment mainly includes one or more of a spike annealing process and a laser annealing process.

However, an annealing temperature of the annealing treatment is high. Because thermal expansion coefficient of each film layer in the stacked structure is different, a stress issue may be easily generated in the stacked structure under the high temperature environment during the annealing treatment. For example, the stress issue may be generated between the sidewall spacer 14, the high-K gate dielectric layer 21, the capping layer 22 and the amorphous silicon layer 23. When the generated stress is too large, the stacked structure may have a cracking issue, such that a gate leakage current may increase, and an isolation effect between a contact-hole plug and the gate structure may be degraded. Therefore, the electrical performance and the yield of the formed semiconductor structure still need to be improved.

The greater the amount of expansion (or shrinkage) of each film layer, the greater the generated stress. The amount of expansion (or shrinkage) is related to the product of the thermal expansion coefficient of the material of each film layer, a temperature difference and a length of the film layer. Correspondingly, the larger the length of the film layer, the greater the amount of expansion (or shrinkage). The length of the film layer is a sum of the length in the opening 20 and the length on the interlayer dielectric layer 16. The amorphous silicon layer 23 is used herein as an example, the length of the amorphous silicon layer 23 is a sum of a length L2 on the sidewall of the opening 20, a length L3 at the bottom of the opening 20, and lengths L1 and L4 on the interlayer dielectric layer 16. In other words, the length of the amorphous silicon layer 23 is (L1+2*L2+L3+L4).

Figure 19:
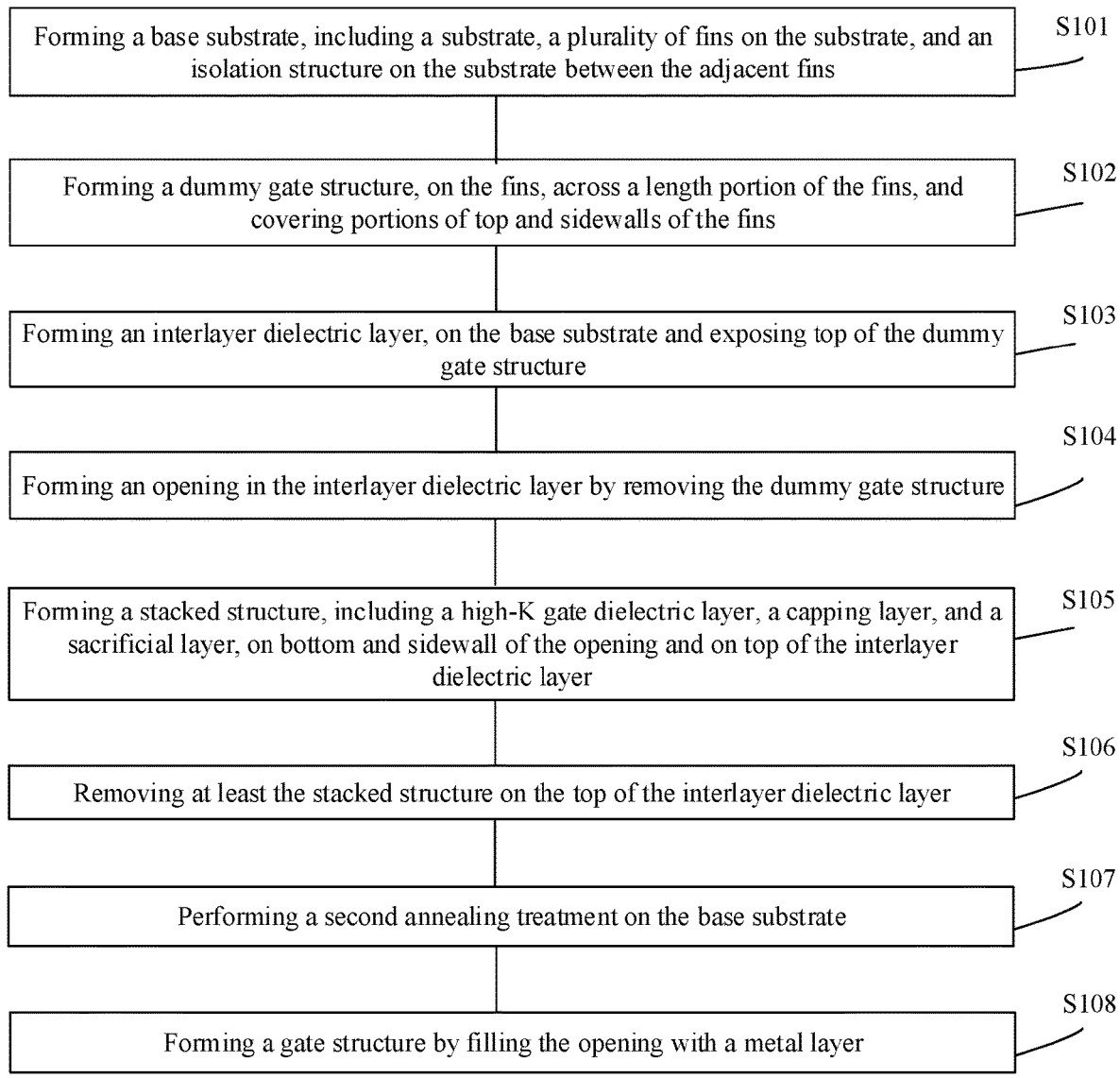
FIG. 19 illustrates an exemplary fabrication method for forming a semiconductor structure consistent with various disclosed embodiments of the present disclosure.

The present disclosure provides a semiconductor structure and fabrication method thereof. FIG. 19 illustrates an exemplary fabrication method for forming a semiconductor structure consistent with various disclosed embodiments; and FIGS. 3-17 illustrate semiconductor structures corresponding to certain stages of the exemplary fabrication process.

Figure 3:
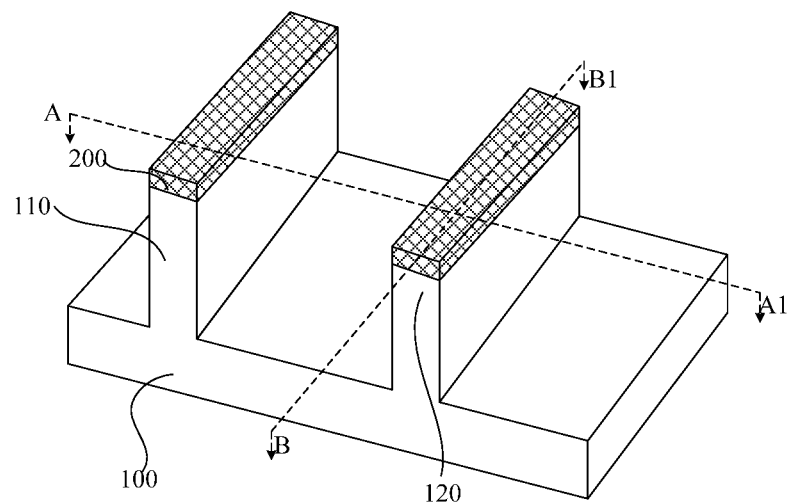
FIGS. 3-17 illustrate semiconductor structures corresponding to certain stages for forming an exemplary semiconductor structure consistent with various disclosed embodiments of the present disclosure.
Figure 4:
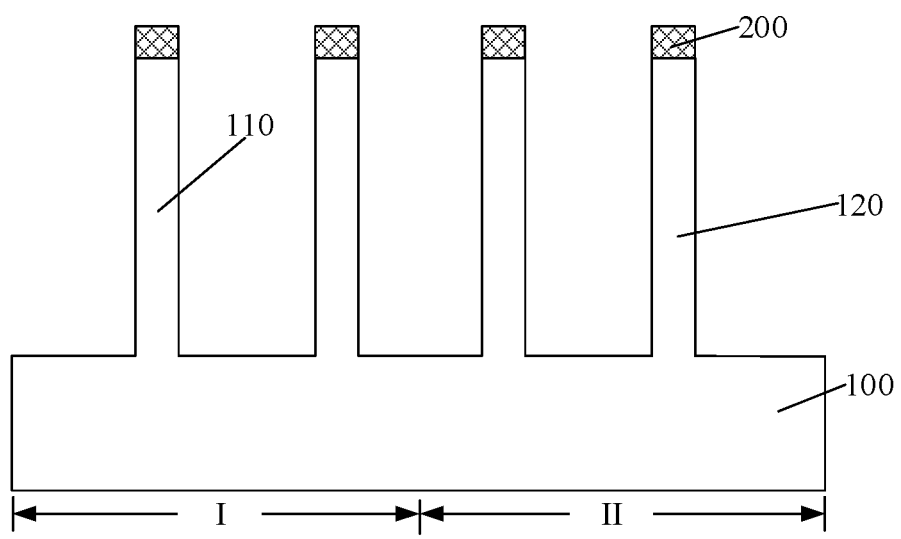
Figure 5:
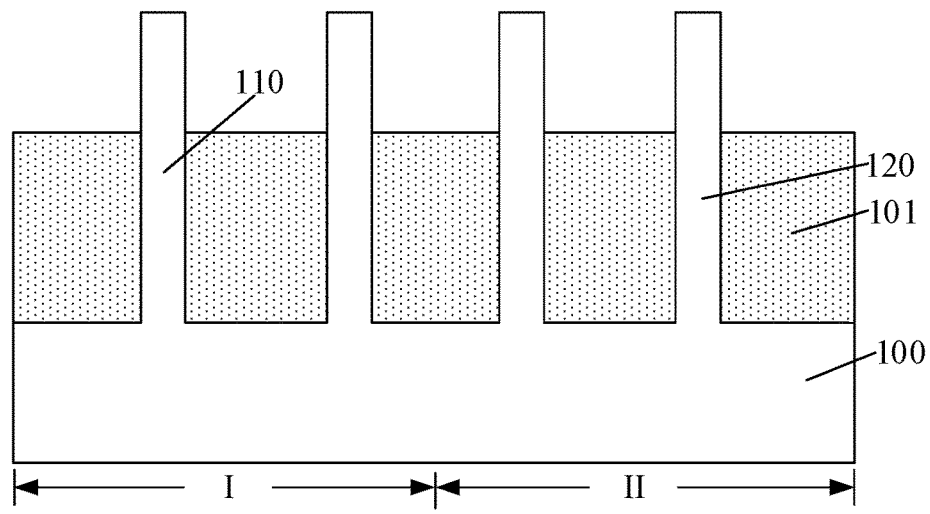

As shown in FIG. 19, at the beginning of the fabrication process, a base substrate with certain structures may be provided (S101). FIGS. 3-5 illustrate corresponding semiconductor structures.

Referring to FIGS. 3-5, a base substrate (not illustrated) may be provided. In one embodiment, the base substrate may be used to form a fin field effect transistor (FinFET). Correspondingly, the base substrate may include a substrate and a plurality of discrete fins formed on the substrate. In certain embodiments, the base substrate may be used to form a planar transistor. Correspondingly, the base substrate may include a planar substrate.

The method for forming the base substrate may include the following. FIG. 3 illustrates a perspective view of the semiconductor structure. FIG. 3 illustrates two fins, the semiconductor structure may also include more than two fins. FIG. 4 illustrates a cross-sectional view along a cutting line 'AA1' in FIG. 3. Referring to FIGS. 3-4, the base substrate may include a substrate 100, and a plurality of discrete fins (not illustrated) may be formed on the substrate 100. The substrate 100 may provide a platform for subsequently forming the FinFET. The fins may be used to provide channels of the formed FinFET.

In one embodiment, the formed FinFET is a CMOS device as an example, the substrate 100 may include a PMOS region I (illustrated in FIG. 4) and an NMOS region II (illustrated in FIG. 4). A plurality of discrete fins may be formed on both the PMOS region I and the NMOS region II of the substrate 100. For example, first fins 110 may be formed on the substrate 100 in the PMOS region I, and second fins 120 may be formed on the substrate 100 in the NMOS region II. In certain embodiments, when the formed FinFET includes an NMOS device, the substrate may include an NMOS region. When the formed FinFET includes a PMOS device, the substrate may include a PMOS region.

In one embodiment, the PMOS region I and the NMOS region II may be adjacent regions. In certain embodiments, the PMOS region and the NMOS region may be isolated from each other.

In one embodiment, the substrate may be made of silicon, germanium, silicon germanium, silicon carbide, gallium arsenide, or gallium indium, etc. In certain embodiments, the substrate may be made of a silicon substrate on the insulator, or a germanium substrate on the insulator, etc.

To increase carrier mobility of the PMOS device, the substrate in the PMOS region I may be a germanium-containing substrate. In one embodiment, the substrate in the PMOS region I may be a germanium substrate. In certain embodiments, the substrate in the PMOS region I may be made of silicon germanium. The substrate in the PMOS region I may also be the germanium substrate on the insulator. The substrate in the PMOS region I may be made of materials adapted to process requirements and easy integration.

To increase carrier mobility of the NMOS device, the substrate in the NMOS region II may be Group III-V compounds substrates, including an indium gallium arsenide substrate, a gallium nitride substrate, or a gallium arsenide substrate, etc. In one embodiment, the substrate in the NMOS region II may be made of indium gallium arsenide. The substrate in the NMOS region II may be made of materials adapted to process requirements and easy integration.

In one embodiment, a method for forming the substrate 100 and the fins may include: providing an initial substrate; forming a patterned fin mask layer 200 (illustrated in FIG. 4) on the initial substrate; and etching the initial substrate by using the patterned fin mask layer 200 as a mask. The etched initial substrate may be used as the substrate 100, and the protrusions formed on the substrate 100 may be used as the fins.

In one embodiment, after forming the substrate 100 and the fins, the fin mask layer 200 on top of the fins may be retained. The fin mask layer 200 may be made of silicon nitride. Top surface of the fin mask layer 200 may be used to define a stop position of a planarization process when subsequently performing the planarization process, and to protect the top of the fins.

Referring to FIG. 5, after forming the substrate 100 and the fins, the method for forming the base substrate may also include forming an isolation structure 101 on the substrate 100 between the adjacent fins. The isolation structure 101 may cover portions of sidewalls of the fins, and top of the isolation structure 101 may be lower than the top of the fins.

The isolation structure 101 serving as an isolation structure of a semiconductor device may be used to isolate adjacent devices and to isolate the adjacent fins. In one embodiment, the isolation structure 101 may be made of silicon oxide. In certain embodiments, the isolation structure may be made of silicon nitride, or silicon oxynitride, etc.

In one embodiment, a method for forming the isolation structure 101 may include: forming an isolation film on the substrate 100 between the adjacent fins, where top of the isolation film may be above the top of the fin mask layer 200 (illustrated in FIG. 4); polishing to remove the isolation film above the top of the fin mask layer 200; back-etching portions of thickness of the remaining isolation film until the top and portions of sidewalls of the fins are exposed to form the isolation structure 101; and removing the fin mask layer 200.

Figure 6:
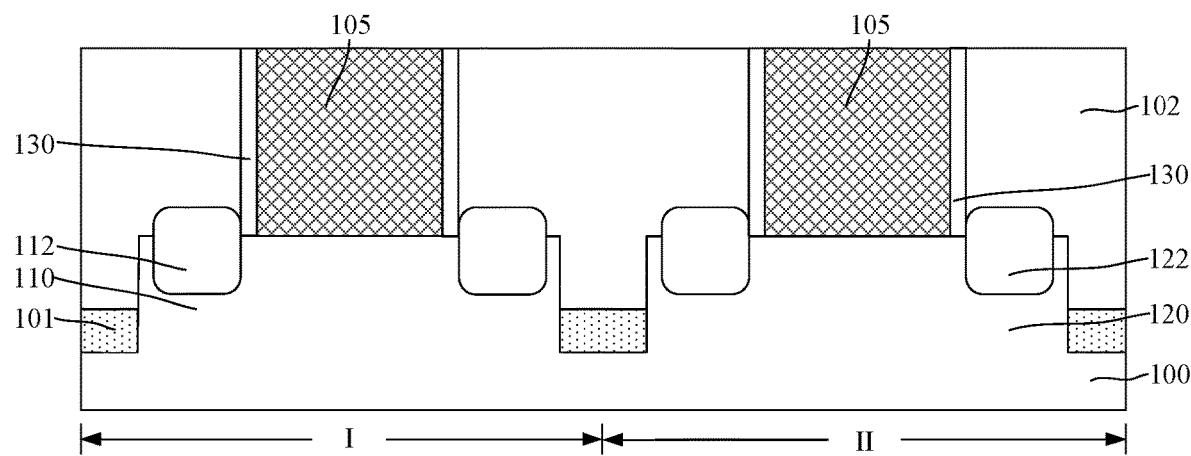

Returning to FIG. 19, after forming the base substrate, a dummy gate structure may be formed (S102). FIG. 6 illustrates a corresponding semiconductor structure.

FIG. 6 illustrates a cross-sectional view along a length direction of the fins (cutting line 'BB1' in FIG. 3) in FIG. 5. Referring to FIG. 6, a dummy gate structure 105 may be formed on the fins and across a length portion of the fins. The dummy gate structure 105 may also cover portions of top and sidewalls of the fins (not illustrated).

In one embodiment, a high-K metal-gate last process may be used to form the semiconductor structure. The dummy gate structure 105 in the PMOS region I may occupy a special location for subsequently forming a gate structure of the PMOS device. The dummy gate structure 105 in the NMOS region II may occupy a special location for subsequently forming a gate structure of the NMOS device.

The dummy gate structure 105 may be a single-layer structure, or a stacked structure. In one embodiment, the dummy gate structure 105 may include a dummy gate layer. In another embodiment, the dummy gate structure 105 may include a dummy oxide layer and a dummy gate layer on the dummy oxide layer. The dummy gate layer may be made of polysilicon, silicon oxide, silicon nitride, silicon oxynitride, silicon carbide, silicon carbonitride, silicon carboxynitride, or amorphous carbon, etc. The dummy oxide layer may be made of silicon oxide, or silicon oxynitride, etc.

In one embodiment, after forming the dummy gate structure 105, a sidewall spacer 130 may be formed on sidewall of the dummy gate structure 105. After forming the sidewall spacer 130, source and drain doped regions (not illustrated) may be formed in the fins on both sides of the dummy gate structure 105.

The sidewall spacer 130 may be used to define the positions of the source and drain doped regions. The sidewall spacer 130 may be made of silicon oxide, silicon nitride, silicon carbide, silicon carbonitride, silicon carboxynitride, silicon oxynitride, boron nitride, or boron carbonitride, etc. The sidewall spacer 130 may be a single-layer structure, or a stacked structure. In one embodiment, the sidewall spacer 130 may be a single-layer structure, and the sidewall spacer 130 may be made of silicon nitride.

In one embodiment, the substrate 100 may include the PMOS region I and the NMOS region II. First source and drain doped regions 112 may be formed in the first fin 110 on both sides of the dummy gate structure 105 in the PMOS region I. Second source and drain doped regions 122 may be formed in the second fin 120 on both sides of the dummy gate structure 105 in the NMOS region II. In one embodiment, the first source and drain doped regions 112 may be doped with P-type ions, including one or more of B, Ga and In. The second source and drain doped regions 122 may be doped with N-type ions, including one or more of P, As and Sb.

Returning to FIG. 19, after forming the source and drain doped regions, an interlayer dielectric layer may be formed (S103). FIG. 6 illustrates a corresponding semiconductor structure.

Referring to FIG. 6, after forming the source and drain doped regions (not illustrated), an interlayer dielectric layer 102 may be formed on the base substrate exposed by the dummy gate structure 105. The interlayer dielectric layer 102 may expose top of the dummy gate structure 105.

The interlayer dielectric layer 102 may provide a platform for subsequently forming the gate structures of the PMOS device and the NMOS device, and may provide a platform for forming a contact-hole plug (CT). At the same time, the interlayer dielectric layer 102 may isolate the adjacent devices.

The interlayer dielectric layer 102 may be made of an insulating material. The interlayer dielectric layer 102 may be made of silicon oxide, silicon nitride, silicon oxynitride, or silicon carboxynitride, etc. In one embodiment, the interlayer dielectric layer 102 may be made of silicon oxide.

In one embodiment, top of the interlayer dielectric layer 102 may be coplanar with the top of the dummy gate structure 105. In one embodiment, a method for forming the interlayer dielectric layer 102 may include: forming an interlayer dielectric film on the base substrate exposed by the dummy gate structure 105, where top of the interlayer dielectric film may be above the top of the dummy gate structure 105; and removing the interlayer dielectric film above the top of the dummy gate structure 105 to form the interlayer dielectric layer.

Figure 7:
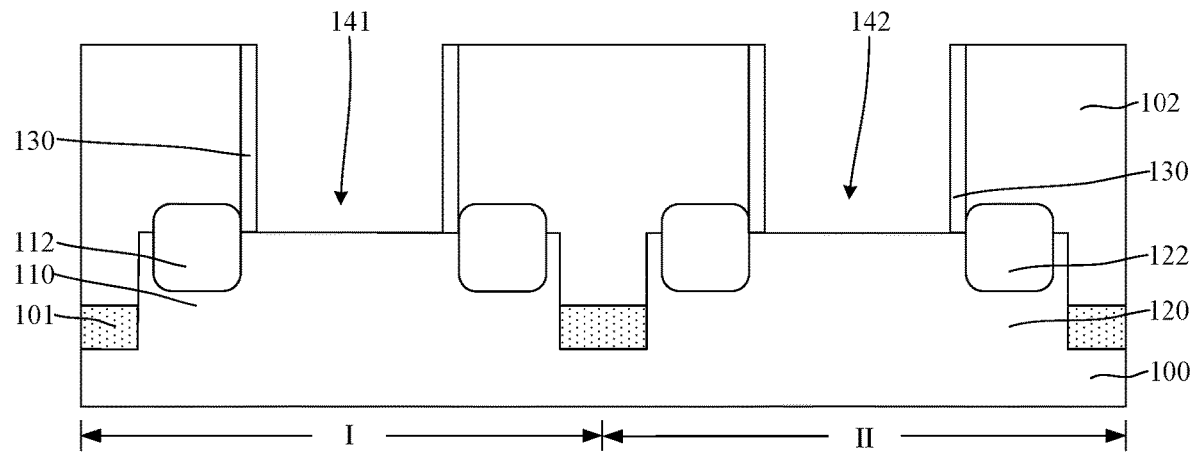

Returning to FIG. 19, after forming the interlayer dielectric layer, an opening in the interlayer dielectric layer may be formed (S104). FIG. 7 illustrates a corresponding semiconductor structure.

Referring to FIG. 7, the dummy gate structure 105 (shown in FIG. 6) may be removed to form an opening (not illustrated) in the interlayer dielectric layer 102. The opening may expose surface portions of the fins (not illustrated).

In one embodiment, a first opening 141 may be formed in the PMOS region I, and a second opening 142 may be formed in the NMOS region II. For example, the dummy gate structure 105 in the PMOS region I may be removed to form the first opening 141 in the interlayer dielectric layer 102 in the PMOS region I, exposing surface portions of the first fins 110. The dummy gate structure 105 in the NMOS region II may be removed to form the second opening 142 in the interlayer dielectric layer 102 in the NMOS region II, exposing surface portions of the second fins 120.

Figure 8:
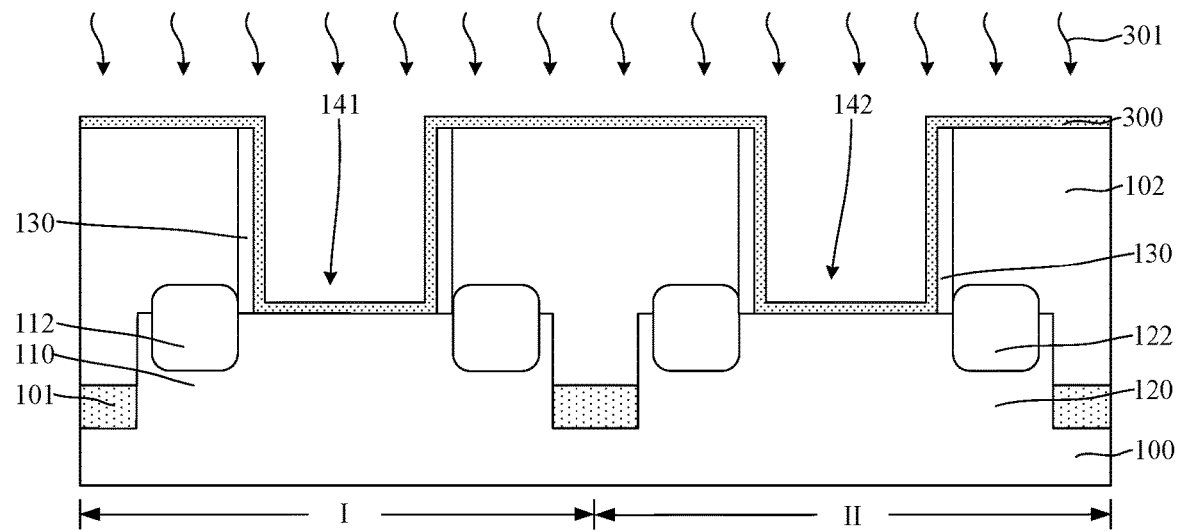
Figure 9:
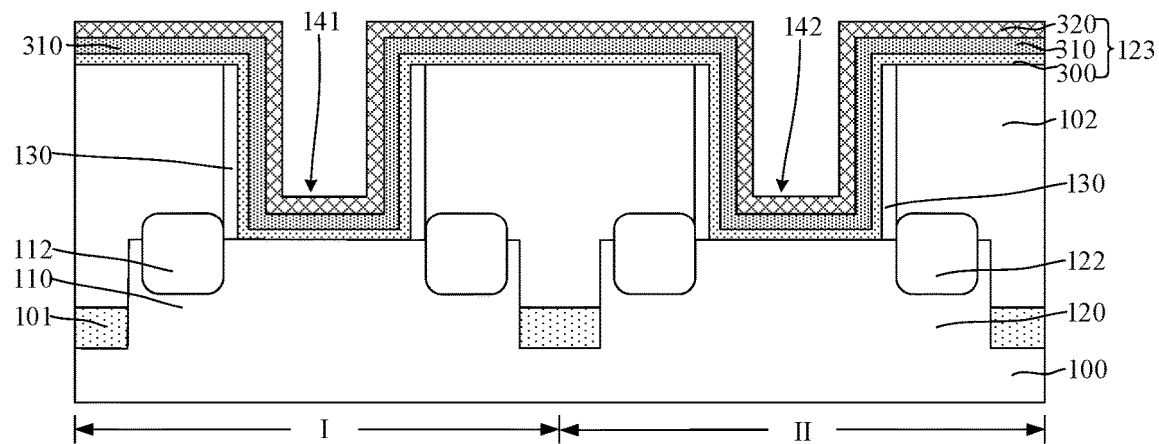

Returning to FIG. 19, after forming the opening in the interlayer dielectric layer, a stacked structure may be formed (S105). FIGS. 8-9 illustrate corresponding semiconductor structures.

Referring to FIGS. 8-9, a stacked structure 123 may be formed, including a high-K gate dielectric layer 300, a capping layer 310, and a sacrificial layer 320. The high-K gate dielectric layer 300 (illustrated in FIG. 8) may be formed at the bottom and on sidewalls of the openings (not illustrated). The high-K gate dielectric layer 300 may also cover the top of the interlayer dielectric layer 102. The capping layer 310 (illustrated in FIG. 9) may be formed on the high-K gate dielectric layer 300, and the sacrificial layer 320 (illustrated in FIG. 9) may be formed on the capping layer 310.

The high-K gate dielectric layer 300 may be made of a gate dielectric material having a relative permittivity greater than a relative permittivity of silicon oxide. In one embodiment, the high-K gate dielectric layer 300 may be made of $HfO_2$. In certain embodiments, the high-K gate dielectric layer may be made of HfSiO, HfSiON, HfTaO, HfSiO, HfZrO, $ZrO_2$, or $Al_2O_3$, etc.

In one embodiment, the high-K gate dielectric layer 300 may be formed by an atomic layer deposition process. The high-K gate dielectric layer 300 may not only be formed in the first opening 141 and the second opening 142, but also be formed on the top of the interlayer dielectric layer 102.

To ensure desired interface performance between the high-K gate dielectric layer 300 and the base substrate, and to improve the formation quality of the high-K gate dielectric layer 300, before forming the high-K gate dielectric layer 300, an interfacial layer (IL, not illustrated) may be formed on the bottom of the first opening 141 and on the bottom of the second opening 142. In one embodiment, the interfacial layer may be formed by a chemical infiltration oxidation process. The interfacial layer may be made of silicon oxide.

When subsequently forming a work function layer in the first opening 141 and in the second opening 142, the capping layer 310 may protect the high-K gate dielectric layer 300, such that metal ions in the work function layer cannot be diffused into the high-K gate dielectric layer 300. At the same time, the capping layer 310 may prevent oxygen ions in the high-K gate dielectric layer 300 from being diffused into the work function layer, such that oxygen vacancy content in the high-K gate dielectric layer 300 may not increase. In one embodiment, the capping layer 310 may be made of TiN. In certain embodiments, the capping layer may be made of TiSiN, or TaN, etc.

The sacrificial layer 320 may be used to improve the electrical performance stability of the subsequently formed device. In one embodiment, the sacrificial layer 320 may be made of amorphous silicon (a-Si).

Subsequent processes may include the following. A filling layer may be formed in the first opening 141 and in the second opening 142. The filling layer may also cover the top of the sacrificial layer 320. The filling layer above the top of the sacrificial layer 320 may be removed. The top surface of the sacrificial layer 320 may be used to define a stop position when removing the filling layer above the top of the sacrificial layer 320. The sacrificial layer 320 may be removed in subsequent processes. Therefore, a thickness of the sacrificial layer 320 cannot be too small nor too large. If the thickness of the sacrificial layer 320 is too small, the sacrificial layer 320 cannot effectively define the stop position; if the thickness of the sacrificial layer 320 is too large, process difficulty for subsequently removing the sacrificial layer 320 may increase. Therefore, in one embodiment, the thickness of the sacrificial layer 320 may be in a range of approximately 40 Å-120 Å.

Referring to FIG. 8, to improve the quality and performance of the high-K gate dielectric layer 300, after forming the high-K gate dielectric layer 300 and before forming the capping layer 310, a first annealing treatment 301 may be performed on the base substrate.

In one embodiment, the first annealing treatment 301 may include a rapid thermal annealing treatment. Parameter of the rapid thermal annealing treatment may include an annealing temperature in a range of approximately 600° C.-800° C. In certain embodiments, the first annealing treatment may include a spike annealing treatment.

Returning to FIG. 19, after forming the stacked structure, at least the stacked structure on the top of the interlayer dielectric layer may be removed (S106). FIGS. 10-14 illustrate corresponding semiconductor structures.

Subsequent processes may include a second annealing treatment. Under the influence of the second annealing treatment, the stacked structure may undergo thermal expansion and contraction. The amount of expansion (or shrinkage) may be related to a length of the stacked structure 123. The length of the stacked structure 123 may be a sum of a length on the sidewall of the opening, a length at the bottom of the opening, and a length on the top of the interlayer dielectric layer 102. The stacked structure 123 on the interlayer dielectric layer 102 may be referred to a first portion. Therefore, by removing at least the first portion of the stacked structure from the top of the interlayer dielectric layer 102, the length of the stacked structure may be reduced, thereby the amount of expansion (or shrinkage) of the stacked structure may be reduced.

In one embodiment, when removing at least the first portion of the stacked structure, the first portion of the stacked structure and portions of the stacked structure on the sidewall of the opening may be removed. The removed portions of the stacked structure on the sidewall of the opening may be referred to a second portion of the stacked structure. For example, the high-K gate dielectric layer 300, the capping layer 310 and the sacrificial layer 320 on the top of the interlayer dielectric layer 102 may be removed, and portions of the high-K gate dielectric layer 300, the capping layer 310 and the sacrificial layer 320 on the sidewalls of the openings (not illustrated) may also be removed. In certain embodiments, the first portion of the stacked structure may be removed.

The second portion of the stacked structure may be removed. On the one hand, the length of the stacked structure may be further reduced, which may be beneficial for reducing the amount of expansion (or shrinkage) of the stacked structure. On the other hand, the top size of the openings may increase, which may be beneficial for improving the effect of subsequently filling the openings with a metal layer, thus improving the quality of the subsequently formed gate structure.

A height 'M' of the removed second portion of the stacked structure (illustrated in FIG. 13) cannot be too large. If the height 'M' is too large, the remaining amount of the stacked structure may be too small. Since the high-K gate dielectric layer 300 and the capping layer 310 are a part of the subsequently formed gate structure, the quality of the subsequently formed gate structure may be degraded. Therefore, in one embodiment, to avoid adversely affecting the quality of the subsequently formed gate structure while reducing the length of the stacked structure, the ratio of the height 'M' of the removed second portion of the stacked structure over a depth of the opening may be less than or equal to approximately ⅓.

Figure 10:
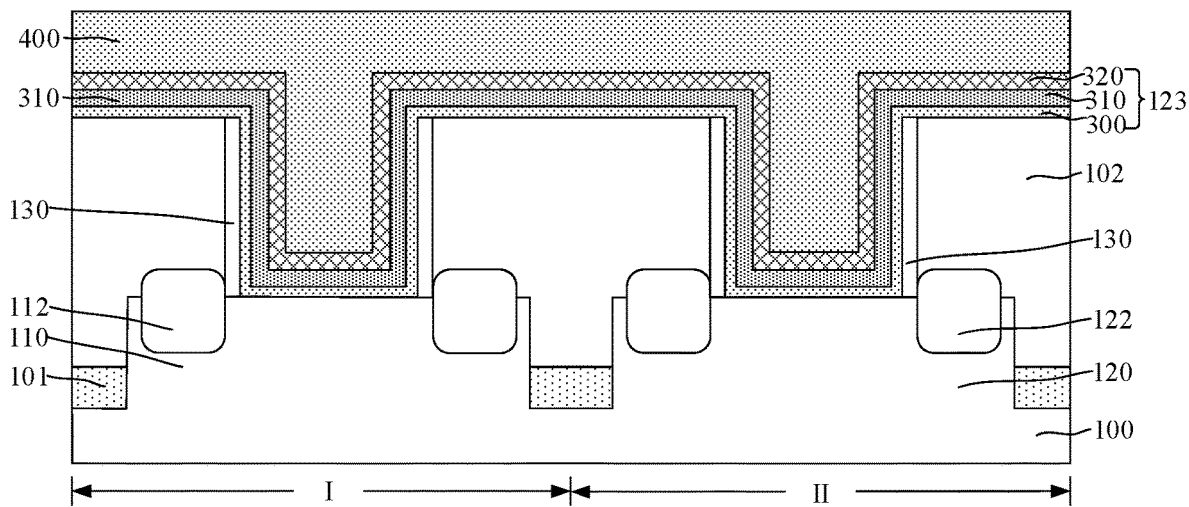

Referring to FIG. 10, a filling layer 400 may be formed in the opening. The filling layer 400 may also cover the top of the stacked structure.

Portions of thickness of the filling layer 400 in the opening may be subsequently removed, and the remaining filling layer 400 may provide a platform for removing portions of the stacked structure. After removing the first portion of the stacked structure from the top of the interlayer dielectric layer 102 and the second portion of the stacked structure having a preset height 'M' from the sidewall of the opening (illustrated in FIG. 13), the filling layer 400 may be removed.

Therefore, the filling layer 400 may be made of a material different from the stacked structure. In contrast to the interlayer dielectric layer 102, the filling layer 400 may be made of a material adapted to easy removal, such that damages on the stacked structure and on the interlayer dielectric layer 102 caused by the process for removing the filling layer 400 may be reduced.

In one embodiment, the filling layer 400 may be made of an organic dielectric layer (ODL) material. The filling layer 400 may be formed by a spin coating process. For example, the filling layer 400 may be filled in the first opening 141 (illustrated in FIG. 9) and in the second opening 142 (illustrated in FIG. 9), and the top of the filling layer 400 may be above the top of the sacrificial layer 320. In certain embodiments, the filling layer 400 may be made of a bottom anti-reflective coating (BARC) material, a deep UV light absorbing oxide (DUO) material, or a photoresist material, etc. Among them, the DUO material is a silicone polymer material, including $CH_3$—SiOX, Si—OH, or $SiOH_3$, etc.

Figure 11:
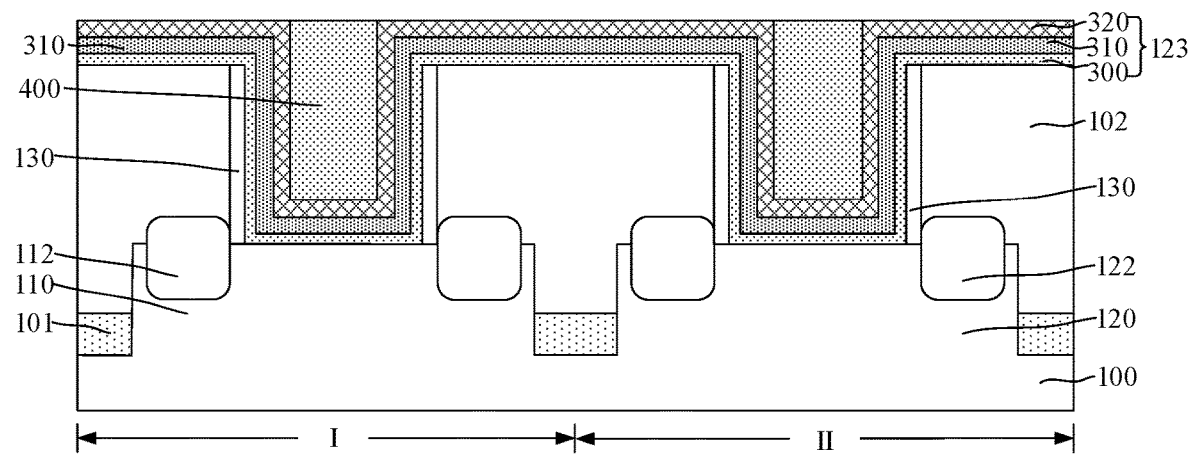

Referring to FIG. 11, a first removal process may be used to remove the filling layer 400 on the top of the stacked structure 123 to expose the top of the stacked structure. The first removal process may provide a platform for subsequently removing portions of thickness of the filling layer 400 in the openings, thus the thickness uniformity of the remaining filling layer 400 in the openings may be improved.

In one embodiment, the top surface of the sacrificial layer 320 may serve as the stop position for removing the filling layer 400 above the sacrificial layer 320. In other words, the top of the remaining filling layer 400 may be coplanar with the top of the sacrificial layer 320 after performing the first removal process. In one embodiment, the first removal process may include a chemical mechanical polishing process. In certain embodiments, the first removal process may include a dry etching process.

Figure 12:
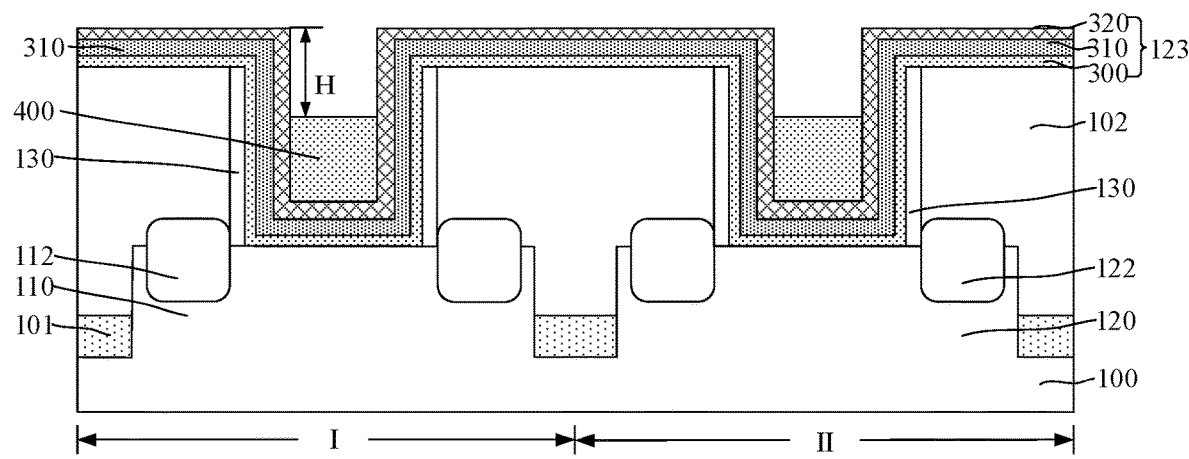

Referring to FIG. 12, a second removal process may be performed to remove portions of thickness of the filling layer 400 in the openings (not illustrated). After performing the second removal process, the remaining filling layer 400 may provide a platform for subsequently etching the stacked structure 123. In other words, the subsequent process may include removing the stacked structure above the remaining filling layer 400. The filling layer 400 may also protect the stacked structure at the bottom of the openings when subsequently removing the stacked structure. Thus, during the steps of the second removal process, the removal amount 'H' of the filling layer 400 may be determined according to the height 'M' of the subsequently removed stacked structure 123 (illustrated in FIG. 13) on the sidewalls of the openings.

In one embodiment, portions of thickness of the filling layer 400 in the first opening 141 (illustrated in FIG. 9) and in the second opening 142 (illustrated in FIG. 9) may be removed. In one embodiment, the second removal process may include a dry etching process.

Figure 13:
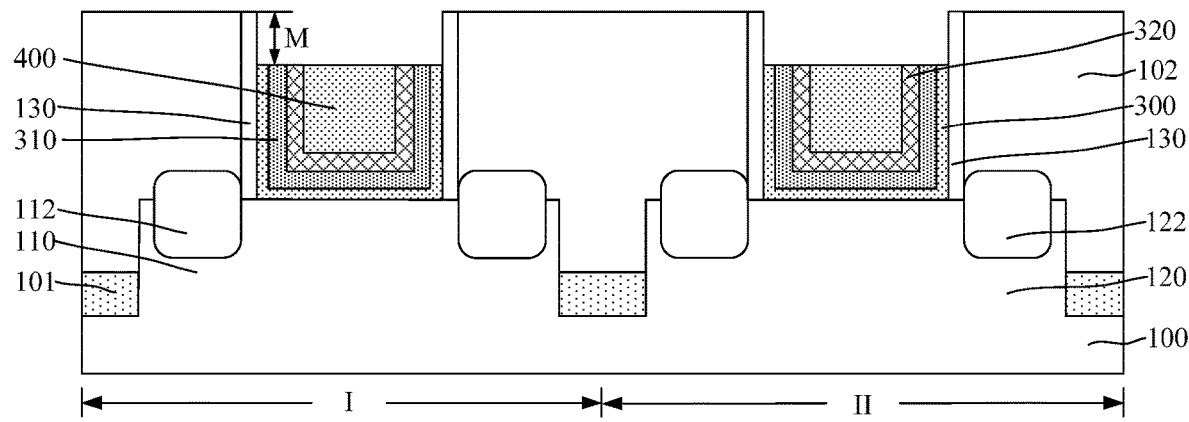

Referring to FIG. 13, after performing the second removal process, the stacked structure 123 above the top of the remaining filling layer 400 may be removed. In one embodiment, after removing the high-K gate dielectric layer 300, the capping layer 310, and the sacrificial layer 320 over the top of the interlayer dielectric layer 102, portions of the high-K gate dielectric layer 300, the capping layer 310, and the sacrificial layer 320 on the sidewall of the first opening 141 (illustrated in FIG. 9) and on the sidewall of the second opening 142 (illustrated in FIG. 9) may also be removed.

In one embodiment, the process for removing the stacked structure 123 above the top of the remaining filling layer 400 may include a dry etching process. For example, the sacrificial layer 320 above the top of the remaining filling layer 400 may be first removed, then the capping layer 310 above the top of the remaining filling layer 400 may be removed, and then the high-K gate dielectric layer 300 above the top of the remaining filling layer 400 may be removed. Parameters of the dry etching processes corresponding to the sacrificial layer 320, the capping layer 310 and the high-K gate dielectric layer 300 may be respectively set to reasonable values to achieve the desired removal amount needed for the process.

Figure 14:
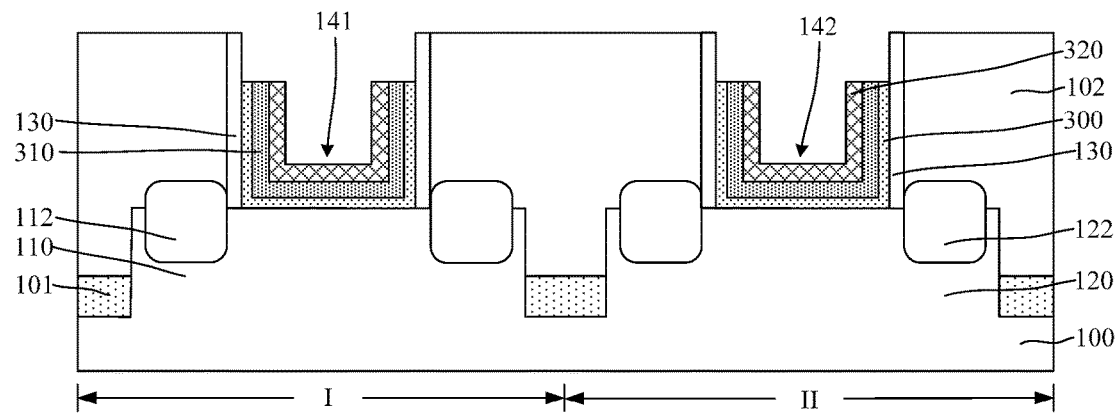

Referring to FIG. 14, the remaining filling layer 400 may be removed after removing the stacked structure above the top of the filling layer 400 (illustrated in FIG. 13). In one embodiment, a dry etching process may be performed to remove the remaining filling layer 400. For example, an etching gas used in the dry etching process may include $CF_4$, or $CHF_3$, etc. In certain embodiments, a wet etching process may be performed to remove the remaining filling layer.

Figure 15:
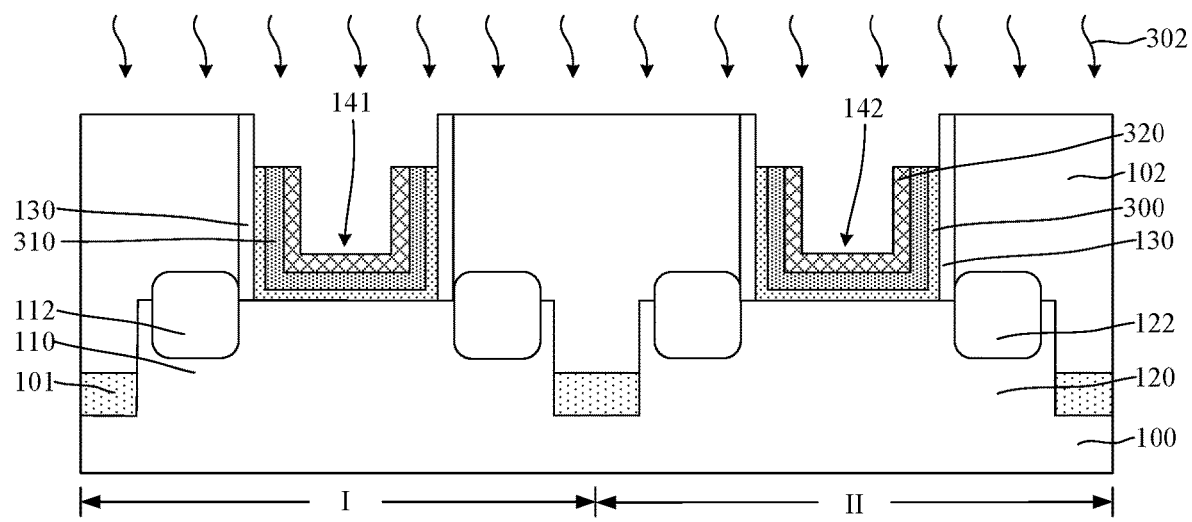

Returning to FIG. 19, after removing at least the first portion of the stacked structure from the top of the interlayer dielectric layer, a second annealing treatment may be performed (S107). FIG. 15 illustrates a corresponding semiconductor structure.

Referring to FIG. 15, a second annealing treatment 302 may be performed on the base substrate after removing at least the first portion of the stacked structure 123. The second annealing treatment 302 may be used to repair the high-K gate dielectric layer 300 to increase the density of the high-K gate dielectric layer 300, thereby the quality and performance of the high-K gate dielectric layer 300 may be improved.

In one embodiment, the second annealing treatment 302 may include a spike annealing treatment. To avoid adverse effect on the distribution of doped ions in the base substrate while improving the quality and performance of the high-K gate dielectric layer 300, parameters of the spike annealing treatment may include an annealing temperature in a range of approximately 800° C.-1000° C., and a pressure at a standard atmospheric pressure.

In another embodiment, the second annealing treatment may include a laser annealing treatment. Parameters of the laser annealing treatment may include an annealing temperature in a range of approximately 950° C.-1150° C., and a pressure at a standard atmospheric pressure.

In certain embodiments, the second annealing treatment may include performing the spike annealing treatment on the base substrate, and performing the laser annealing treatment on the base substrate after performing the spike annealing treatment. The passivation issue of the doped ions may be avoided by first performing the low temperature spike annealing treatment, and then performing the high temperature laser annealing treatment.

Figure 16:
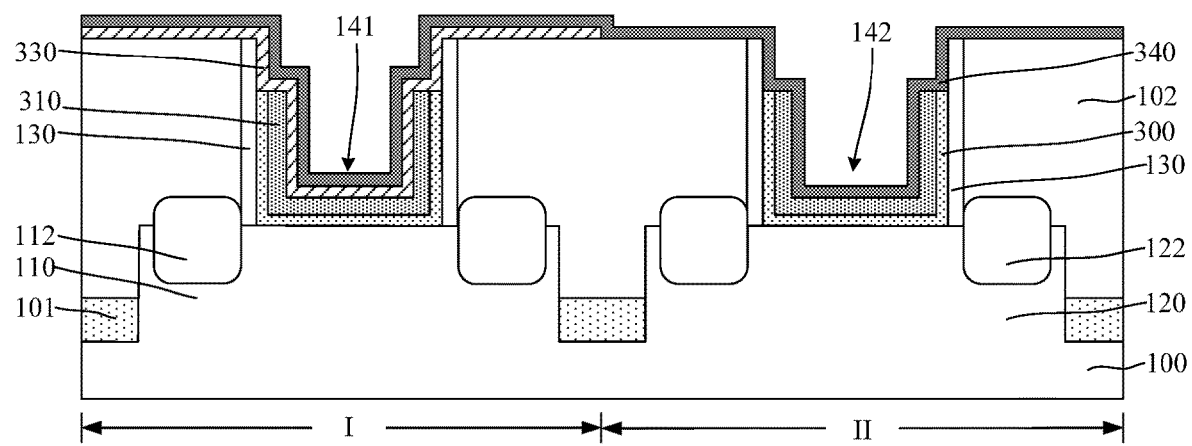
Figure 17:
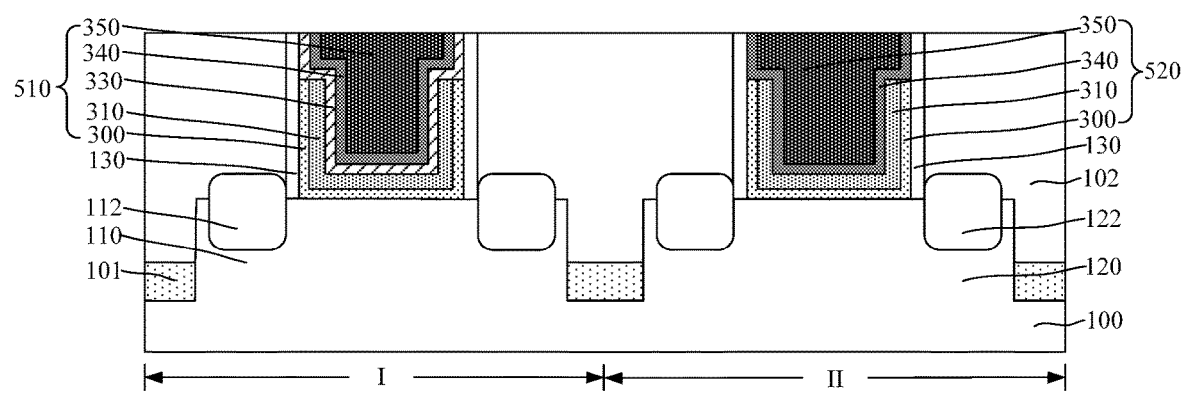

Returning to FIG. 19, after performing the second annealing treatment, a gate structure may be formed (S108). FIGS. 16-17 illustrate corresponding semiconductor structures.

Referring to FIGS. 16-17, after performing the second annealing treatment 302 (illustrated in FIG. 15), the openings (not illustrated) may be filled with a metal layer 350 (illustrated in FIG. 17) to form a gate structure (not illustrated).

After removing at least the first portion of the stacked structure from the top of the interlayer dielectric layer 102, the remaining sacrificial layer 320 (illustrated in FIG. 15) may be removed. In one embodiment, the remaining sacrificial layer 320 may be removed by a wet etching process. An etching solution used in the wet etching process may include a tetramethylammonium hydroxide (TMAH) solution, or an aqueous ammonia (NH$_4$OH), etc. A solution temperature may be in a range of approximately 25° C.-75° C.

In one embodiment, the gate structure may include the remaining high-K gate dielectric layer 300, the capping layer 310, and the metal layer 350 in the openings. The gate structure may be across a length portion of the fins (not illustrated), and may cover portions of the top and sidewalls of the fins.

In one embodiment, the metal layer 350 may be made of W. In certain embodiments, the metal layer may be made of Al, Cu, Ag, Au, Pt, Ni, or Ti, etc.

In one embodiment, referring to FIG. 16, after removing at least the first portion of the stacked structure and before filling the openings with the metal layer 350, the method may also include forming a P-type work function layer 330 on the bottom and sidewall of the first opening 141 and on the bottom and sidewall of the second opening 142. The P-type work function layer 330 may also cover the top of the interlayer dielectric layer 102. In addition, the method may include removing the P-type work function layer in the NMOS region II; and forming an N-type work function layer 340 on the bottom and sidewall of the second opening 142 after removing the P-type work function layer 330 in the NMOS region II. The N-type work function layer 340 may also cover the top of the interlayer dielectric layer 102 in the NMOS region II and the P-type work function layer 330. In one embodiment, the N-type work function layer 340 on the P-type work function layer 330 may be retained after forming the N-type work function layer 340 to reduce the process difficulty and to save the mask.

Because the top of the high-K gate dielectric layer 300 and the capping layer 310 is lower than the top of the openings (not illustrated), the P-type work function layer 330 may be formed on the capping layer 310 in the first opening 141 and on the exposed sidewall spacer 130 in the first opening 141 when forming the P-type work function layer 330. The N-type work function layer 340 may be formed on the capping layer 310 in the second opening 142 and on the exposed sidewall spacer 130 in the second opening 142 when forming the N-type work function layer 340.

The P-type work function layer 330 may be used to adjust the threshold voltage of a P-type device. The P-type work function layer 330 may be made of a P-type work function material. The work function of the P-type work function material may be in a range of approximately 5.1 eV-5.5 eV, including 5.2 eV, 5.3 eV, or 5.4 eV, etc. The P-type work function layer 330 may be made of one or more of TiN, TaN, TaSiN and TiSiN. The P-type work function layer 330 may be formed by one or more of a chemical vapor deposition process, a physical vapor deposition process, and an atomic layer deposition process.

The N-type work function layer 340 may be used to adjust the threshold voltage of an N-type device. The N-type work function layer 340 may be made of an N-type work function material. The work function of the N-type work function material may be in a range of approximately 3.9 eV-4.5 eV, including 4 eV, 4.1 eV, or 4.3 eV, etc. The N-type work function layer 340 may be made of one or more of TiAl, TiAlC, TaAlN, TiAlN, TaCN and AlN. The N-type work function layer 340 may be formed by one or more of a chemical vapor deposition process, a physical vapor deposition process, and an atomic layer deposition process.

Correspondingly, the method for forming the gate structure may include filling the first opening 141 (illustrated in FIG. 16) and the second opening 142 (illustrated in FIG. 16) with the metal layer 350. The metal layer 350 may also cover the top of the N-type work function layer 340. The method may also include removing the metal layer 350 over the top of the interlayer dielectric layer 102, and removing the N-type work function layer 340 and the P-type work function layer 330 from the top of the interlayer dielectric layer 102. A gate structure in the PMOS region I may include the high-K gate dielectric layer 300, the capping layer 310, the P-type work function layer 330, the N-type work function layer 340, and the metal layer 350 in the first opening 141. The gate structure in the PMOS region I may be referred to a first gate structure 510. A gate structure in the NMOS region II may include the high-K gate dielectric layer 300, the capping layer 310, the N-type work function layer 340, and the metal layer 350 in the second opening 142. The gate structure in the NMOS region II may be referred to a second gate structure 520.

Figure 18:
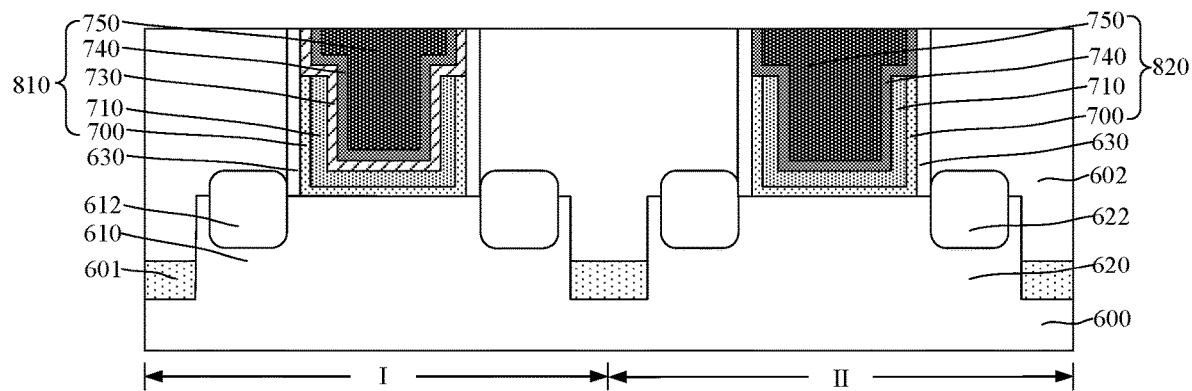
FIG. 18 illustrates a semiconductor structure consistent with various disclosed embodiments of the present disclosure.

A semiconductor structure is also provided in the present disclosure. FIG. 18 illustrates a semiconductor structure consistent with the disclosed embodiments.

Referring to FIG. 18, the semiconductor structure may include a base substrate, and an interlayer dielectric layer 602 formed on the base substrate. The interlayer dielectric layer 602 may have opening, exposing portions of the base substrate. The semiconductor substructure may also include a stacked structure in the opening. The top of the stacked structure may be lower than the top of the opening. Further, the semiconductor structure may include a metal layer 750 formed on the stacked structure in the opening.

In one embodiment, the base substrate may include a FinFET. Correspondingly, the base substrate may include a substrate 600 and a plurality of discrete fins (not illustrated) on the substrate 600. In certain embodiments, the base substrate may include a planar transistor. Correspondingly, the base substrate may be a planar base substrate.

In an exemplary embodiment, the FinFET on the base substrate is a CMOS device, the substrate 600 may include a PMOS region I and an NMOS region II. A plurality of discrete fins may be formed on both the PMOS region I and the NMOS region II of the substrate 600. For example, first fins 610 may be formed on the substrate 600 in the PMOS region I, and second fins 620 may be formed on the substrate 600 in the NMOS region II. In certain embodiments, when the FinFET includes an NMOS device, the substrate may include an NMOS region. When the FinFET exclusively includes a PMOS device, the substrate may include a PMOS region.

In one embodiment, the PMOS region I and the NMOS region II may be adjacent regions. In certain embodiments, the PMOS region and the NMOS region may be isolated from each other.

In one embodiment, the substrate may be made of silicon, germanium, silicon germanium, silicon carbide, gallium arsenide, or gallium indium, etc. In certain embodiments, the substrate may be made of a silicon substrate on the insulator, or a germanium substrate on the insulator, etc.

To increase carrier mobility of the PMOS device, the substrate in the PMOS region I may be a germanium-containing substrate. In one embodiment, the substrate in the PMOS region I may be a germanium substrate. In certain embodiments, the substrate in the PMOS region I may be made of silicon germanium, or the germanium substrate on the insulator, etc. The substrate in the PMOS region I may be made of materials adapted to process requirements and easy integration.

To increase carrier mobility of the NMOS device, the substrate in the NMOS region II may be Group III-V compounds substrates, including an indium gallium arsenide substrate, a gallium nitride substrate, or a gallium arsenide substrate, etc. In one embodiment, the substrate in the NMOS region II may be made of indium gallium arsenide. The substrate in the NMOS region II may be made of materials adapted to process requirements and easy integration.

In one embodiment, the semiconductor structure may also include an isolation structure 601 formed on the substrate 600 between the adjacent fins. The isolation structure 601 may cover portions of sidewalls of the fins, and the top of the isolation structure 601 may be lower than the top of the fins.

The isolation structure 601 serving as an isolation structure for a semiconductor device may be used to isolate adjacent devices and to isolate adjacent fins. In one embodiment, the isolation structure 601 may be made of silicon oxide. In certain embodiments, the isolation structure may be made of silicon nitride, or silicon oxynitride, etc.

The interlayer dielectric layer 602 may be made of an insulating material, and may provide a platform for forming a contact-hole plug (CT). At the same time, the interlayer dielectric layer 602 may be used to isolate the adjacent devices. The interlayer dielectric layer 602 may be made of silicon oxide, silicon nitride, silicon oxynitride, or silicon carboxynitride, etc. In one embodiment, the interlayer dielectric layer 602 may be made of silicon oxide.

In one embodiment, a first opening (not illustrated) may be formed in the PMOS region I, and a second opening (not illustrated) may be formed in the NMOS region II. The first opening may expose portions of the first fins 610, and the second opening may expose portions of the second fins 620. Correspondingly, the stacked structure in the PMOS region I may be across a length portion of the first fins 610 and cover portions of the top and sidewalls of the first fins 610. The stacked structure in the NMOS region II may be across a length portion of the second fins 620 and cover portions of the top and sidewalls of the second fins 620.

In one embodiment, the stacked structure may include a high-K gate dielectric layer 700 at the bottom of the opening and on portions of sidewall of the opening, and a capping layer 710 on the high-K gate dielectric layer 700. A gate structure of the semiconductor structure may include the high-K gate dielectric layer 700, the capping layer 710, and the metal layer 750 in the opening. The top of the gate structure may be coplanar with the top of the interlayer dielectric layer 602. In one embodiment, a first gate structure 810 may include the high-K gate dielectric layer 700, the capping layer 710 and the metal layer 750 in the first opening, and a second gate structure 820 may include the high-K gate dielectric layer 700, the capping layer 710 and the metal layer 750 in the second opening.

In one embodiment, the semiconductor structure may also include a sidewall spacer 630 formed on the sidewall of the opening, and source and drain doped regions formed in the fin on both sides of the opening.

The sidewall spacer 630 may be used to define the positions of the source and drain doped regions. The sidewall spacer 630 may be made of silicon oxide, silicon nitride, silicon carbide, silicon carbonitride, silicon carboxynitride, silicon oxynitride, boron nitride, or boron carbonitride, etc. The sidewall spacer 630 may be a single-layer structure or a stacked structure. In one embodiment, the sidewall spacer 630 may be a single-layer structure, and the sidewall spacer 630 may be made of silicon nitride.

In one embodiment, first source and drain doped regions 612 may be formed in the first fin 610 on both sides of the first opening. Second source and drain doped regions 622 may be formed in the second fin 620 on both sides of the second opening. In other words, the first source and drain doped regions 612 may be formed in the first fin 610 on both sides of the first gate structure 810. The second source and drain doped regions 622 may be formed in the second fin 620 on both sides of the second gate structure 820. In one embodiment, the first source and drain doped regions 612 may be doped with P-type ions, including one or more of B, Ga and In. The second source and drain doped regions 622 may be doped with N-type ions, including one or more of P, As and Sb.

Correspondingly, the high-K gate dielectric layer 700 may be formed at the bottom of the opening and on portions of the sidewall spacer 630. The high-K gate dielectric layer 700 may be made of a gate dielectric material having a relative permittivity greater than the relative permittivity of silicon oxide. In one embodiment, the high-K gate dielectric layer 700 may be made of $HfO_2$. In certain embodiments, the high-K gate dielectric layer may be made of HfSiO, HfSiON, HfTaO, HfTiO, HfZrO, $ZrO_2$, or $Al_2O_3$, etc.

To ensure desired interface performance between the high-K gate dielectric layer 700 and the base substrate, and to improve the quality of the high-K gate dielectric layer 700, the semiconductor structure may also include an interfacial layer (IL, not illustrated) formed at the bottom of the first opening and at the bottom of the second opening. In one embodiment, the interfacial layer may be made of silicon oxide.

The stacked structure may also be formed on the top of the interlayer dielectric layer 602 when forming the stacked structure during the process for forming the semiconductor structure. An annealing treatment may be performed after forming the stacked structure. Under the influence of the annealing treatment, the stacked structure may undergo thermal expansion and contraction. The amount of expansion (or shrinkage) may be related to a length of the stacked structure. When the stacked structure is also formed on the top of the interlayer dielectric layer 602, the length of the stacked structure may be a sum of a length on the sidewall of the opening, a length at the bottom of the opening, and a length on the top of the interlayer dielectric layer 602.

Therefore, in one embodiment, the top of the stacked structure may be lower than the top of the opening. On the one hand, the length of the stacked structure may be further reduced, which may be beneficial for reducing the amount of expansion (or shrinkage) of the stacked structure. On the other hand, the top size of the opening may increase, which may be beneficial for improving the quality of the metal layer 530.

A ratio of a distance between the top of the stacked structure and the top of the opening over a depth of the opening cannot be too large. If the ratio is too large, a thickness of the stacked structure on portions of the sidewall of the opening may be too small. Since the high-K gate dielectric layer 700 and the capping layer 710 are a part of the gate structure, the quality of the gate structure may be degraded. Therefore, in one embodiment, the ratio of the distance between the top of the stacked structure and the top of the opening over the depth of the opening may be less than or equal to approximately ⅓.

In one embodiment, the semiconductor structure may also include a work function layer to adjust the threshold voltage of the device. In one embodiment, the work function layer may include a P-type work function layer 730 formed between the metal layer 750 and the stacked structure in the first opening, and an N-type work function layer 740 formed between the metal layer 750 and the stacked structure in the second opening.

The P-type work function layer 730 may be used to adjust the threshold voltage of a P-type device. The P-type work function layer 730 may be made of a P-type work function material. The work function of the P-type work function material may be in a range of approximately 5.1 eV-5.5 eV, including 5.2 eV, 5.3 eV or 5.4 eV, etc. The P-type work function layer 730 may be made of one or more of TiN, TaN, TaSiN and TiSiN.

The N-type work function layer 740 may be used to adjust the threshold voltage of an N-type device. The N-type work function layer 740 may be made of an N-type work function material. The work function of the N-type work function material may be in a range of approximately 3.9 eV-4.5 eV, including 4 eV, 4.1 eV or 4.3 eV, etc. The N-type work function layer 740 may be made of one or more of TiAl, TiAlC, TaAlN, TiAlN, TaCN and AlN.

In one embodiment, to reduce the process difficulty for forming the N-type work function layer 740 and to save the mask, the N-type work function layer 740 may also be formed between the metal layer 750 and the P-type work function layer 730. Correspondingly, the first gate structure 810 may also include the P-type work function layer 730 and the N-type work function layer 740. The second gate structure 820 may also include the N-type work function layer 740.

The capping layer 710 may be used to protect the high-K gate dielectric layer 700, such that metal ions in the work function layer cannot be diffused into the high-K gate dielectric layer 700. At the same time, the capping layer 710 may prevent oxygen ions in the high-K gate dielectric layer 700 from being diffused into the work function layer, such that oxygen vacancy content in the high-K gate dielectric layer 700 may not increase. In one embodiment, the capping layer 710 may be made of TiN. In certain embodiments, the capping layer may be made of TiSiN, or TaN, etc.

In the fabrication method for forming the semiconductor structure consistent with various disclosed embodiments, the interlayer dielectric layer having an opening exposing surface portions of the base substrate may be formed on the base substrate. A stacked structure may be formed on the bottom and sidewall of the opening and on the top of the interlayer dielectric layer. At least a first portion of the stacked structure may be removed from the top of the interlayer dielectric layer before performing the annealing treatment on the base substrate. Under the influence of the annealing treatment, the stacked structure may undergo thermal expansion and contraction. The amount of expansion (or shrinkage) may be related to the length of the stacked structure. When the stacked structure still remains on the top of the interlayer dielectric layer, the length of the stacked structure may be a sum of a length on the sidewall of the opening, a length at the bottom of the opening, and a length on the top of the interlayer dielectric layer. Thus, by removing at least the first portion of the stacked structure from the top of the interlayer dielectric layer, the length of the stacked structure may be reduced, thereby the amount of expansion (or shrinkage) of the stacked structure may be reduced. Correspondingly, the stacked structure may be less likely to have a cracking issue caused by too large generated stress. Thus, a gate leakage current may be reduced, and an isolation effect between a contact-hole plug and the gate structure in the semiconductor structure may be improved. Therefore, the electrical performance and the yield of the formed semiconductor structure may be improved.

When removing at least the first portion of the stacked structure from the top of the interlayer dielectric layer, the stacked structure on the top of the interlayer dielectric layer and portions of the stacked structure on the sidewall of the opening may be removed. On the one hand, the length of the stacked structure may be further reduced, which may be beneficial for reducing the amount of expansion (or shrinkage) of the stacked structure. On the other hand, the top size of the opening may increase, which may be beneficial for improving the effect of subsequently filling the opening with the metal layer, thus improving the quality of the subsequently formed gate structure.

The semiconductor structure consistent with various disclosed embodiments may include a base substrate; an interlayer dielectric layer, on the base substrate and having an opening exposing surface portions of the base substrate; a stacked structure, in the opening and having a top surface lower than the opening; and a metal layer, on the stacked structure in the opening. When forming the stacked structure during the process for forming the semiconductor structure, the stacked structure may be formed on the top of the interlayer dielectric layer. An annealing treatment may be performed after forming the stacked structure. Under the influence of the annealing treatment, the stacked structure may undergo thermal expansion and contraction. The amount of expansion (or shrinkage) may be related to the length of the stacked structure. When the stacked structure still remains on the top of the interlayer dielectric layer, the length of the stacked structure may be a sum of a length on the sidewall of the opening, a length at the bottom of the opening, and a length on the top of the interlayer dielectric layer. Thus, in the present disclosure, the top of the stacked structure may be lower than the top of the opening, such that the length of the stacked structure may be reduced, thereby the amount of expansion (or shrinkage) of the stacked structure may be reduced. Correspondingly, the stacked structure may be less likely to have a cracking issue caused by too large generated stress. Thus, a gate leakage current may be reduced, and an isolation effect between a contact-hole plug and the gate structure in the semiconductor structure may be improved. The top size of the opening may increase, which may be beneficial for improving the formation quality of the metal layer, thus improving the quality of the gate structure of the semiconductor structure. Therefore, the electrical performance and the yield of the formed semiconductor structure in the present disclosure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those skilled in the art. Any equivalent or modification thereof, without departing from the spirit and principle of the present disclosure, falls within the true scope of the present disclosure.

What is claimed is:

1. A method for fabricating a semiconductor structure, comprising:
   providing a base substrate;
   forming an interlayer dielectric layer, on the base substrate and having an opening exposing surface portions of the base substrate;
   forming a stacked structure, the stacked structure including a first portion on a top of the interlayer dielectric layer and a second portion on a bottom and sidewall of the opening, wherein forming the stacked structure includes:
  forming a high-K gate dielectric layer, on the bottom and sidewall of the opening and on the top of the interlayer dielectric layer;
  forming a capping layer, on the high-K gate dielectric layer; and
  forming a sacrificial layer, on the capping layer;
removing at least the first portion of the stacked structure exposing the top of the interlayer dielectric layer;
performing an annealing treatment on the base substrate after at least the first portion of the stacked structure is removed;
after performing the annealing treatment and before filling the opening with a metal layer, removing the sacrificial layer and forming a work function layer on the capping layer; and
forming a gate structure by filling the opening with the metal layer.

2. The method according to claim 1, before forming the stacked structure in the opening, further including:
  forming an interfacial layer on the bottom of the opening by a chemical infiltration oxidation process, wherein the interfacial layer is made of a material including silicon oxide.

3. The method according to claim 1, wherein removing at least the first portion of the stacked structure from the top of the interlayer dielectric layer includes:
  removing the first portion of the stacked structure from the top of the interlayer dielectric layer; or
  removing the first portion of the stacked structure from the top of the interlayer dielectric layer and removing a portion of the second portion of the stacked structure from the sidewall of the opening.

4. The method according to claim 1, wherein:
  the high-K gate dielectric layer is made of one of $HfO_2$, HfSiO, HfSiON, HfTaO, HfTiO, HfZrO, $ZrO_2$, and $Al_2O_3$;
  the capping layer is made of one of TiN, TiSiN, and TaN;
  the sacrificial layer is made of amorphous silicon; and
  a thickness of the sacrificial layer is in a range of approximately 40 Å-120 Å.

5. The method according to claim 1, after forming the high-K gate dielectric layer and before forming the capping layer, further including:
  performing a rapid thermal annealing treatment at an annealing temperature in a range of approximately 600° C.-800° C.

6. The method according to claim 3, wherein:
  when removing the portion of the second portion of the stacked structure from the sidewall of the opening, a ratio of a height of the removed portion of the second portion of the stacked structure on the sidewall of the opening over a depth of the opening is less than or equal to approximately ⅓.

7. The method according to claim 3, wherein removing the first portion of the stacked structure from the top of the interlayer dielectric layer and removing the portion of the second portion of the stacked structure from the sidewall of the opening include:
  forming a filling layer in the opening, and on the stacked structure;
  performing a first removal process to remove the filling layer over the top of the interlayer dielectric layer until a top surface of the stacked structure is exposed;
  performing a second removal process to remove portions of a thickness of the filling layer in the opening;
  removing the first and the portion of the second portions of the stacked structure above a top surface of the remaining filling layer; and
  removing the remaining filling layer.

8. The method according to claim 7, wherein:
  the first removal process includes one of a chemical mechanical polishing process and a dry etching process; and
  the second removal process includes a dry etching process.

9. The method according to claim 7, wherein:
  the filling layer is made of one of an organic dielectric layer material, a bottom anti-reflective coating material, a deep UV light absorbing oxide material, and a photoresist material.

10. The method according to claim 1, wherein:
  removing the first portion of the stacked structure from the top of the interlayer dielectric layer includes a dry etching process.

11. The method according to claim 1, wherein performing the annealing treatment on the base substrate includes:
  performing one of a spike annealing treatment and a laser annealing treatment on the base substrate; or
  performing a laser annealing treatment on the base substrate followed by performing a spike annealing treatment on the base substrate.

12. The method according to claim 11, wherein parameters of the spike annealing treatment include:
  an annealing temperature in a range of approximately 800° C.-1000° C.; and
  a pressure at a standard atmospheric pressure.

13. The method according to claim 11, wherein parameters of the laser annealing treatment include:
  an annealing temperature in a range of approximately 950° C.-1150° C.; and
  a pressure at a standard atmospheric pressure.

14. The method according to claim 3, wherein
  removing the portion of the second portion of the stacked structure from the sidewall of the opening exposes a portion of the sidewall of the opening.

15. The method according to claim 1, wherein
  the work function layer is formed the capping layer covering exposed surfaces of the capping layer and the portion of the sidewall of the opening.

* * * * *